(12) United States Patent
Chang et al.

(10) Patent No.: US 12,388,404 B2
(45) Date of Patent: Aug. 12, 2025

(54) FEEDBACK CIRCUIT WITH ADJUSTABLE GAIN AND RADIO FREQUENCY CIRCUIT UTILIZING THE SAME

(71) Applicant: RichWave Technology Corp., Taipei (TW)

(72) Inventors: Hang Chang, Taipei (TW); Chih-Sheng Chen, Taipei (TW)

(73) Assignee: RichWave Technology Corp., Taipei (TW)

( * ) Notice: Subject to any disclaimer, the term of this patent is extended or adjusted under 35 U.S.C. 154(b) by 511 days.

(21) Appl. No.: 18/084,572

(22) Filed: Dec. 20, 2022

(65) Prior Publication Data
US 2024/0171134 A1    May 23, 2024

(30) Foreign Application Priority Data
Nov. 22, 2022  (TW) .................... 111144532

(51) Int. Cl.
*H03F 1/34*    (2006.01)
*H03F 1/02*    (2006.01)
*H03F 1/56*    (2006.01)
*H03F 3/19*    (2006.01)

(52) U.S. Cl.
CPC .............. *H03F 3/19* (2013.01); *H03F 1/0205* (2013.01); *H03F 1/56* (2013.01); *H03F 2200/222* (2013.01); *H03F 2200/387* (2013.01); *H03F 2200/451* (2013.01)

(58) Field of Classification Search
CPC ....................................................... H03F 1/34
USPC ...................................................... 330/86, 87
See application file for complete search history.

(56) References Cited

U.S. PATENT DOCUMENTS

| | | |
|---|---|---|
| 6,657,489 B1 | 12/2003 | Ziazadeh |
| 2020/0177134 A1 | 6/2020 | Wakaki |

FOREIGN PATENT DOCUMENTS

| | | |
|---|---|---|
| CN | 100459420 C | 2/2009 |
| CN | 107147366 A | 9/2017 |
| TW | 200934100 | 8/2009 |

OTHER PUBLICATIONS

Office action mailed on Jun. 21, 2024 for the Taiwan application No. 111144532, filing date Nov. 22, 2022, p. 1-20.
Office action mailed on Dec. 25, 2023 for the Taiwan application No. 111144532, filing date Nov. 22, 2022, pp. 1-12. ,Dec. 25, 2023.

*Primary Examiner* — Henry Choe
(74) *Attorney, Agent, or Firm* — Winston Hsu

(57) ABSTRACT

A feedback circuit coupled between an input terminal and an output terminal of an amplifier circuit includes an input terminal, an output terminal, a first set of transistors and a second set of transistors. The first set of transistors is coupled between the input terminal and the output terminal of the feedback circuit, and includes a first terminal, a second terminal, and a control terminal used to receive a first control signal to turn on or off the first set of transistors. The second set of transistors is coupled between the input terminal and the output terminal of the feedback circuit, and includes a first terminal, a second terminal, and a control terminal used to receive a second control signal to turn on or off the second set of transistors.

19 Claims, 6 Drawing Sheets

FEEDBACK CIRCUIT WITH ADJUSTABLE GAIN AND RADIO FREQUENCY CIRCUIT UTILIZING THE SAME

TECHNICAL FIELD

The invention relates to an electronic circuit, and in particular, to a feedback circuit with adjustable gain and a radio frequency (RF) circuit utilizing the same.

BACKGROUND

Power amplifiers are widely used in various electronic devices, particularly in radio frequency (RF) devices such as smart phones, WiFi hotspots, and other RF devices. A power amplifier converts a low-power input RF signal into a high-power output RF signal. The power demand for the output RF signal increases as the transmission distance increases.

A feedback circuit may be used for the power amplifier to feed back at least a part of the output RF signal to the input terminal of the power amplifier, so as to control the gain. Generally speaking, the less the feedback amount of the feedback circuit is, the larger the amplifier's gain will be, achieving a favorable gain performance. In the related art, the gain of the amplifier may be adjusted by changing the feedback amount of the feedback circuit. However, the feedback amount of the feedback circuit is such limited by the resistor and/or the control switch in the feedback circuit that it may not be designed with sufficient flexibility to meet various requirements.

SUMMARY

According to an embodiment of the invention, a feedback circuit coupled between an output terminal and an input terminal of an amplifier circuit includes an input terminal, an output terminal, a first set of transistors and a second set of transistors. The first set of transistors is coupled between the input terminal and the output terminal of the feedback circuit, and includes a first terminal, a second terminal, and a control terminal configured to receive a first control signal. The first set of transistors is used to provide two or more impedances according to the first control signal, the two or more impedances of the first set of transistors being no lower than a first predetermined impedance. The second set of transistors is coupled between the input terminal and the output terminal of the feedback circuit, and includes a first terminal coupled to the first terminal of the first set of transistors, a second terminal coupled to the second terminal of the first set of transistors, and a control terminal configured to receive a second control signal. The second set of transistors is used to provide two or more impedances according to the second control signal, the two or more impedances of the second set of transistors being no lower than a second predetermined impedance.

According to another embodiment of the invention, a feedback circuit coupled between an output terminal and an input terminal of an amplifier circuit includes an input terminal, an output terminal, a first set of transistors and a second set of transistors. The first set of transistors is coupled between the input terminal and the output terminal of the feedback circuit, and includes a first terminal, a second terminal, and a control terminal configured to receive a first control signal to turn on or off the first set of transistors. The second set of transistors is coupled between the input terminal and the output terminal of the feedback circuit, and includes a first terminal connected to the first terminal of the first set of transistors, a second terminal connected to the second terminal of the first set of transistors, and a control terminal used to receive a second control signal to turn on or off the second set of transistors.

According to another embodiment of the invention, a radio frequency (RF) circuit includes an amplifier circuit and a feedback circuit. The amplifier circuit includes an input terminal and an output terminal and is used to amplify an RF signal. The feedback circuit is coupled between the output terminal and the input terminal of the amplifier circuit, and includes an input terminal, an output terminal, a first set of transistors and a second set of transistors. The first set of transistors is coupled between the input terminal and the output terminal of the feedback circuit, and includes a first terminal, a second terminal, and a control terminal configured to receive a first control signal. The first set of transistors is used to provide two or more impedances according to the first control signal, and the two or more impedances of the first set of transistors is no lower than a first predetermined impedance. The second set of transistors is coupled between the input terminal and the output terminal of the feedback circuit, and includes a first terminal coupled to the first terminal of the first set of transistors, a second terminal coupled to the second terminal of the first set of transistors, and a control terminal configured to receive a second control signal. The second set of transistors is used to provide two or more impedances according to the second control signal, and the two or more impedances of the first set of transistors is no lower than a second predetermined impedance.

DETAILED DESCRIPTION

Figure 1:
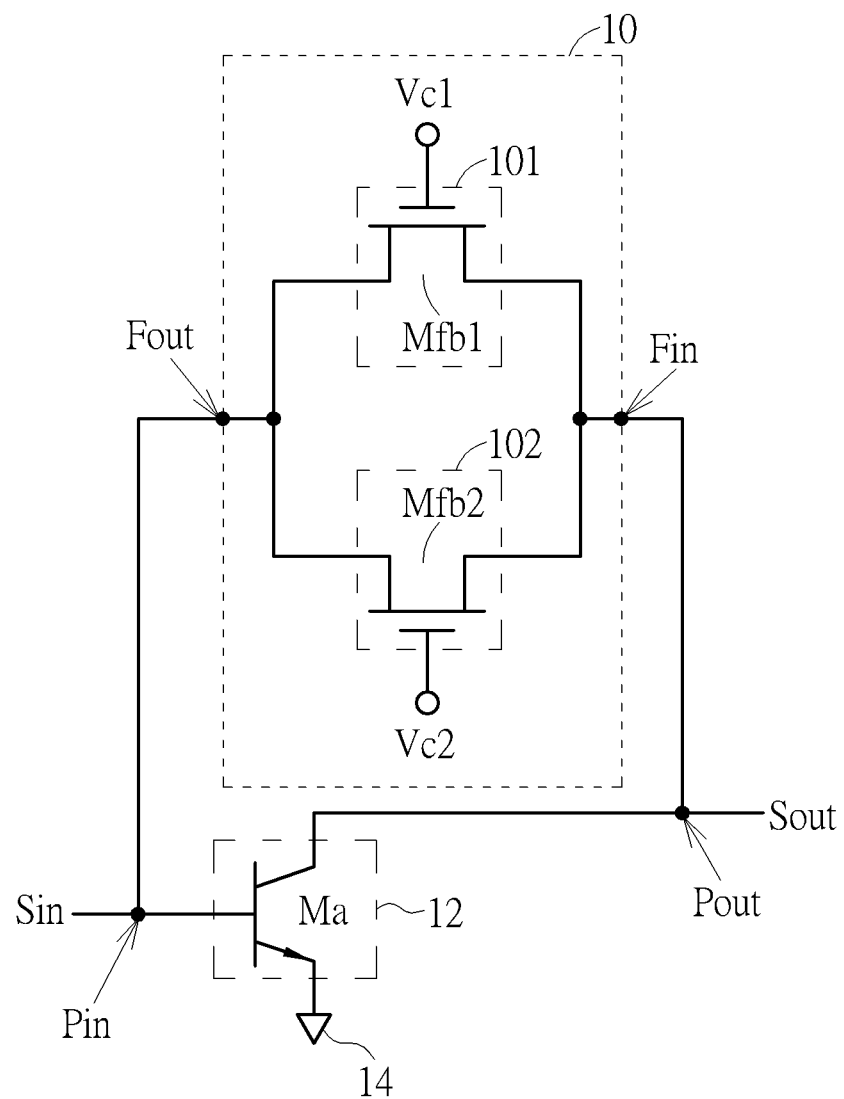
FIG. 1 is a schematic diagram of a radio frequency (RF) circuit according to an embodiment of the invention.

Below, exemplary embodiments will be described in detail with reference to accompanying drawings so as to be easily realized by a person having ordinary knowledge in the art. The inventive concept may be embodied in various forms without being limited to the embodiments set forth herein. Descriptions of well-known parts are omitted for clarity, and like reference numerals refer to like elements throughout.

FIG. 1 is a schematic diagram of a radio frequency (RF) circuit 1 according to an embodiment of the invention. The RF circuit 1 may include an amplification circuit 12 and a feedback circuit 10. The amplifier circuit 12 may receive an input signal Sin and amplify the same to generate an output signal Sout. The input signal Sin and the output signal Sout may be RF signals. The feedback circuit 10 may be coupled between the input terminal Pin and the output terminal Pout of the amplifier circuit 12. In some implementations, the amplifier circuit 12 may include a power amplifier (PA) and a low noise amplifier (LNA).

In some embodiments, the feedback amount of the feedback circuit 10 may be adjusted based on requirements, so as to adjust the gain of the RF circuit 1. For example, the RF circuit 1 may have a plurality of gain modes, and different feedback amounts may be used to achieve different gains in various gain modes. The feedback amount of the feedback circuit 10 may be negatively correlated to the gain level of the RF circuit 1. That is, the less the feedback amount of the feedback circuit 10 is, the larger the gain of the RF circuit 1 will be. Furthermore, the RF circuit 1 may have a first gain mode and second gain mode. The feedback amount of the feedback circuit 10 in the first gain mode may be less than the feedback amount of the same in the second gain mode, and thus the gain in the first gain mode is greater than that in the second gain mode.

In some embodiments, the equivalent impedance of the feedback circuit 10 may be changed to achieve various feedback amounts. For example, the feedback circuit 10 may use the ON resistance and the OFF capacitive reactance of a transistor to control the feedback amount, so as to flexibly adjust the gain of the RF circuit 1. In some embodiments, the feedback circuit 10 may not include any resistor.

As shown in FIG. 1, the amplifier circuit 12 may include an input terminal Pin configured to receive an RF input signal Sin, and an output terminal Pout configured to output an RF output signal Sout. In some embodiments, the amplifier circuit 12 may include an amplifying transistor Ma. The amplifying transistor Ma includes a control terminal coupled to the input terminal Pin of the amplifier circuit 12, a first terminal coupled to the output terminal Pout of the amplifier circuit 12, and a second terminal coupled to the reference voltage terminal 14. The reference voltage terminal 14 may provide a grounding voltage such as 0V. In some embodiments, the amplifying transistor Ma may include a bipolar junction transistor (BJT), and may be configured as a common emitter amplifier. In some other embodiments, the amplification transistor Ma may include a metal-oxide-semiconductor field-effect transistor (MOSFET), and may be configured as a common-source amplifier. For example, the amplifying transistor Ma is an N-type bipolar transistor in FIG. 1.

In some embodiments, the feedback circuit 10 may be coupled between the output terminal Pout and the input terminal Pin of the amplifier circuit 12. The feedback circuit 10 may include an input terminal Fin, an output terminal Fout, a set of transistors 101 and a set of transistors 102. The set of transistors 101 and the set of transistors 102 are coupled between the input terminal Fin and the output terminal Fout of the feedback circuit 10. The input terminal Fin of the feedback circuit 10 may be coupled to the output terminal Pout of the amplifier circuit 12, and the output terminal Fout of the feedback circuit 10 may be coupled to the input terminal Pin of the amplifier circuit 12.

In the embodiment in FIG. 1, the set of transistors 101 may include a first terminal, a second terminal, and a control terminal configured to receive the control signal Vc1. The set of transistors 101 may be turned on or off to provide two or more impedances according to the control signal Vc1. In some embodiments, when the control signal Vc1 is at a logic high level, the set of transistors 101 may be turned on, and when the control signal Vc1 is at a logic low level, the set of transistors 101 may be turned off. The logic high level may be 1.8V and the logic low level may be 0V. For example, the set of transistors 101 may provide an impedance of the first ON resistance when turned on, and provide an impedance of the first OFF capacitive reactance when turned off. Both of the impedances of the set of transistors 101 may be no lower than a first predetermined impedance. For example, the first predetermined impedance may be between 100 ohms (Ω) and soon. For example, the first predetermined impedance may be 200Ω.

In some embodiments, the set of transistors 101 may be selectively configured such that the set of transistors 101 has an ON resistance of 200Ω and an OFF capacitance of 1 femtofarad (fF). In such a case, if operated in an operating frequency of 5.5 Giga Hertz (GHz), the set of transistors 101 has an impedance equal to the ON resistance thereof when turned on, that is, 200Ω. The set of transistors 101 has an impedance equal to $-j*(1/(2\pi*5.5*10^9))$ when turned off, that is, $-j28940\Omega$. In the above embodiment, the set of transistors 101 provides two impedances for the ON state and the OFF state, and the two impedances are no lower than the first predetermined impedance, that is, greater than or equal to mon. In the above embodiment, when the control signal Vc1 is switched between different logic levels, the set of transistors 101 may be in a transition state between the ON state and the OFF state to provide a transient impedance between 200Ω and $-j28940\Omega$.

In some embodiments, the set of transistors 102 may include a first terminal coupled to the first terminal of the set of transistors 101, a second terminal coupled to the second terminal of the set of transistors 101, and a control terminal configured to receive the control signal Vc2. In other words, the set of transistors 102 and the set of transistors 101 may be coupled in parallel. In some embodiments, the first terminal of the set of transistors 102 may be directly connected to the first terminal of the set of transistors 101 without any electronic component therebetween. The second terminal of the set of transistors 102 may also be directly connected to the second terminal of the set of transistors 101 without any electronic component therebetween. In some embodiments, the set of transistors 102 may be turned on when the control signal Vc2 is set to the logic high level, and the set of transistors 102 may be turned off when the control signal Vc2 is set to the logic low level. The set of transistors 102 may provide at least two impedances according to the control signal Vc2. For example, the set of transistors 102 may provide an impedance of the second ON resistance when turned on, and provide an impedance of the second OFF capacitive reactance when turned off. Both of the two impedances of the set of transistors 102 may be no lower than a second predetermined impedance. For example, the second predetermined impedance may be between 100Ω and 500Ω, for example, the second predetermined impedance may be mon.

In some embodiments, the parameters of the set of transistors 102 may be selected to be the same as those of the set of transistors 101. For example, the set of transistors 102 may be configured to have, but is not limited to, an ON resistance of 200Ω and an OFF capacitance of 1 femtofarad (fF). However, in other embodiments, the parameters of the set of transistors 102 may be selected to be different from those of the set of transistors 101. Similar to the set of transistors 101, if operated in an operating frequency of 5.5 GHz, the set of transistors 102 has an impedance equal to the ON resistance thereof when turned on, that is, mon. The set of transistors 102 has an impedance equal to $-j*(1/(2\pi*5.5*10^9))$ when turned off, that is, $-j28940\Omega$. In the above embodiment, the set of transistors 102 provides two impedances for the ON state and the OFF state, and the two impedances are no lower than the second predetermined impedance, that is, greater than or equal to mon. In the above embodiment, when the control signal Vc2 is switched between different logic levels, the set of transistors 102 may be in a transition state between the ON state and the OFF state to provide a transient impedance between 200Ω and −j28940Ω.

In some embodiments, the impedance of the feedback circuit 10 is correlated to the impedance of the set of transistors 101 and the impedance of the set of transistors 102. In some embodiments, when the set of transistors 101 is turned off and the set of transistors 102 is turned on, the set of transistors 101 may provide an impedance of the first OFF capacitive reactance and the set of transistors 102 may provide an impedance of the second ON resistance, such that the impedance of the feedback circuit 10 may be correlated to the first OFF capacitive reactance of the set of transistors 101 and the second ON resistance of the set of transistors 102. Similarly, when the set of transistors 101 is turned on and the set of transistors 102 is turned on, an impedance of the feedback circuit 10 may be correlated to the first ON resistance of the set of transistors 101 and the second ON resistance of the set of transistors 102. When the set of transistors 101 is turned off and the set of transistors 102 is turned off, the impedance of the feedback circuit 10 may be correlated to the first OFF capacitive reactance of the set of transistors 101 and the second OFF capacitive reactance of the set of transistors 102. When the set of transistors 101 is turned on and the set of transistors 102 is turned off, the impedance of the feedback circuit 10 may be correlated to the first ON resistance of the set of transistors 101 and the second OFF capacitive reactance of the set of transistors 102. Further, since the set of transistors 102 and the set of transistors 101 are coupled in parallel in FIG. 1, and the impedance of the feedback circuit 10 is approximately equal to the parallel impedance of the set of transistors 101 and the set of transistors 102. In some embodiments, when the set of transistors 101 is turned off and the set of transistors 102 is turned off, the impedance of the feedback circuit 10 is approximately equal to the parallel impedance of the first OFF capacitive reactance of the set of transistors 101 and the second OFF capacitive reactance of the set of transistors 102.

In the embodiments, the control signals Vc1 and Vc2 may be used respectively to control the sets of transistors 101 and 102 for the feedback circuit 10 to provide various impedances.

In the above embodiments, the first ON resistance of the set of transistors 101 and the second ON resistance of the set of transistors 102 may both be mon. Therefore, if the operating frequency is 5.5 GHz, the set of transistors 101 and the set of transistors 102 may each provide an impedance of mon. The first OFF capacitance of the set of transistors 101 and the second OFF capacitance of the set of transistors 102 may both be 1 fF, and thus, if the operating frequency is 5.5 GHz, the set of transistors 101 and the set of transistors 102 may provide impedances approximately equal to −j28940 Ohm, respectively. The impedances of the feedback circuit 10 in various gain modes may be shown as Table 1 below:

TABLE 1

|  | Vc1 | Vc2 | Impedance of the set of transistors 101 | Impedance of the set of transistors 102 | Impedance of the feedback circuit 10 (Ω) (approx.) |
| --- | --- | --- | --- | --- | --- |
| First gain mode | L | H | −j28940 | 200 | 200 |
| Second gain mode | H | H | 200 | 200 | 100 |

TABLE 1-continued

|  | Vc1 | Vc2 | Impedance of the set of transistors 101 | Impedance of the set of transistors 102 | Impedance of the feedback circuit 10 (Ω) (approx.) |
| --- | --- | --- | --- | --- | --- |
| third gain mode | L | L | −j28940 | −j28940 | −j14470 |
| Fourth gain mode | H | L | 200 | −j28940 | 200 |

In the first gain mode, the control signal Vc1 is set to the logic low level L and the control signal Vc2 is set to the logic high level H to turn off the set of transistors 101 and turn on the set of transistors 102, resulting in the set of transistors 101 providing an impedance of −j28940Ω and the set of transistors 102 providing an impedance of mon. Therefore, the impedance of the feedback circuit 10 is calculated as the parallel impedance of −j28940Ω and 200Ω, that is, approximately equal to 200−j1.34Ω. In such a case, since the real part (200) is much larger than the imaginary part (1.34) of the parallel impedance, the impedance of the feedback circuit 10 is about 200Ω.

In the second gain mode, the control signal Vc1 is set to the logic high level H and the control signal Vc2 is set to the logic high level H to turn on the set of transistors 101 and turn on the set of transistors 102, resulting in the set of transistors 101 providing an impedance of 200Ω and the set of transistors 102 providing an impedance of 200Ω, and the impedance of the feedback circuit 10 is calculated as the parallel impedance of the 200Ω and 200Ω, that is, approximately 100Ω.

In the third gain mode, the control signal Vc1 is set to the logic low level L and the control signal Vc2 is set to the logic low level L to turn off the set of transistors 101 and turn off the set of transistors 102, resulting in the set of transistors 101 providing an impedance of −j28940Ω and the set of transistors 102 providing an impedance of −j28940Ω, and the impedance of the feedback circuit 10 is calculated as the parallel impedance of −j28940Ω and −j28940Ω, that is, approximately −j14470Ω. In this mode, since the set of transistors 101 is turned off and the set of transistors 102 is turned off, the impedance of the feedback circuit 10 is expected to approach infinity, achieving a feedback amount close to zero.

In the fourth gain mode, the control signal Vc1 is set to the logic high level H and the control signal Vc2 is set to the logic low level L to turn on the set of transistors 101 and turn off the set of transistors 102, resulting in the set of transistors 101 providing an impedance of 200Ω, and the set of transistors 102 providing an impedance of −j28940Ω, and the impedance of feedback circuit 10 is calculated as the parallel impedance of 200Ω and −j28940Ω, that is, approximately 200−j1.34Ω. In such a case, since the real part is much larger than the imaginary part of the parallel impedance, the impedance of the feedback circuit 10 is about mon.

It may be seen from Table 1 that in the second gain mode, the feedback circuit 10 may provide a smaller impedance (e.g., about 100Ω). Thus, the RF circuit 1 including the amplifier circuit 12 and the feedback circuit 10 may have thereby have a larger feedback amount to provide a smaller gain. In the third gain mode, the feedback circuit 10 may provide a larger impedance (for example, about −j14470Ω). Thus, a less feedback amount may be achieved, resulting in a larger gain of the RF circuit 1. In addition, the impedances of the feedback circuit 10 in the first gain mode and the fourth gain mode may be the equal to each other and between the impedance of the second gain mode and the impedance of the third gain mode.

It should be noted that the above impedances are calculated in the condition where the set of transistors 101 and the set of transistors 102 have the same ON resistance and OFF capacitive reactance. If the first ON resistance of the set of transistors 101 is different from that of the set of transistors 102, or the first OFF capacitive reactance of the set of transistors 101 is different from that of the set of transistors 102, the impedances of the feedback circuit 10 in the first gain mode and the fourth gain mode may be different from each other. For example, the first ON resistance of set of transistors 101 may be 100Ω, and the second ON resistance of set of transistors 102 may be mon. In the first gain mode, set of transistors 101 is turned off and set of transistors 102 is turned on, and the feedback circuit 10 may provide an impedance of about 200Ω. In the fourth gain mode, the set of transistors 101 is turned on and the set of transistors 102 is turned off, and the feedback circuit 10 may provide an impedance of about 100Ω.

In a conventional feedback circuit, the resistors and switches are used in the feedback circuit, and in order to provide different feedback amounts, switches may be switched to provide different impedances. However, the impedance of the feedback circuit is limited by the resistance of the resistors and/or the OFF capacitive reactance of the switches. In comparison, in the embodiment, by configuring the set of transistors 101 and the set of transistors 102, the feedback circuit 10 may not include resistors, and the feedback circuit 10 may thus provide a larger equivalent impedance to achieve a less feedback amount, so as to achieve a higher gain of the RF circuit 1. Furthermore, the feedback circuit 10 of the embodiment in the present disclosure may avoid the use of resistors, thereby saving the circuit area.

In some embodiments, the set of transistors 101 may include M transistors Mfb1 coupled in cascode and the set of transistors 102 may include N transistors Mfb2 coupled in cascode, where M is a positive integer and N is a positive integer. The M transistors Mfb1 and the N transistors Mfb2 may include bipolar junction transistors (bipolar junction transistor, BJT) or metal oxide semiconductor field effect transistors (MOSFET). In FIG. 1, M is equal to 1 and N is equal to 1, and the transistors Mfb1 and Mfb2 are both NMOS transistors.

Figure 2:
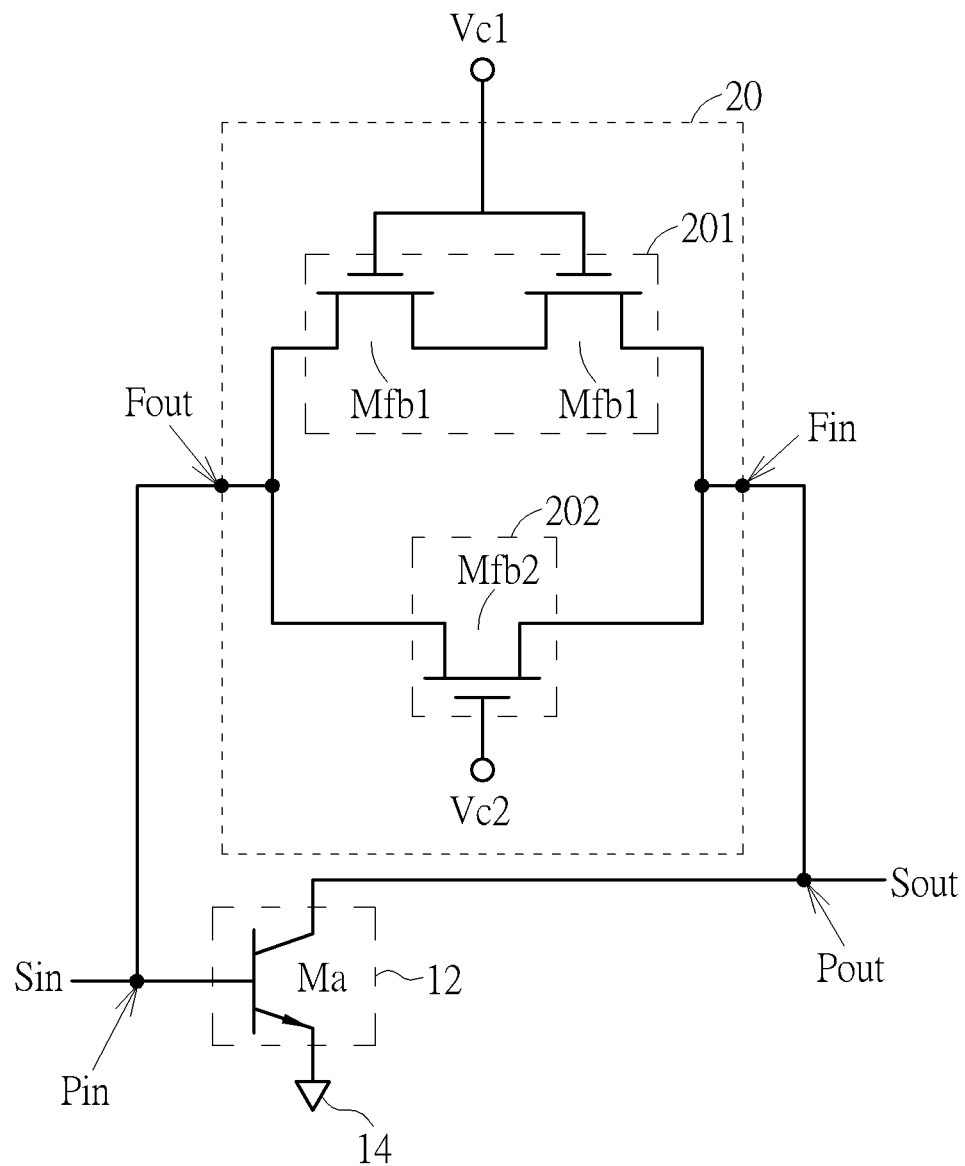
FIG. 2 is a schematic diagram of an RF circuit according to another embodiment of the invention.

FIG. 2 is a schematic diagram of an RF circuit 2 according to another embodiment of the invention. The main difference between the RF circuit 2 and the RF circuit 1 lies in that the set of transistors 201 in the feedback circuit 20 includes two cascoded transistors Mfb1. The main differences between the RF circuit 2 and the RF circuit 1 are explained as follows, and the explanations for other components may be found in the preceding paragraphs, and will not be repeated here.

In FIG. 2, M is equal to 2 and N is equal to 1. The set of transistors 201 includes two cascoded transistors Mfb1, and the control terminals of the two transistors Mfb1 are coupled to the control terminal of the set of transistors 101 to receive the control signal Vc1. However, the present invention is not limited to the configuration in FIG. 2. In some embodiments, the control terminals of the two transistors Mfb1 may respectively receive different control signals.

In some embodiments, the sizes of the two transistors Mfb1 may be the identical to each other, and thus the ON resistances and the OFF capacitive reactances of the two transistors Mfb1 may be equal. Therefore, if the operating frequency is 5.5 GHz, each transistor Mfb1 may provide an impedance of about 200Ω when turned on, and may provide an impedance of about −j28940Ω when turned off. Therefore, the set of transistors 201 may provide an impedance of about 400Ω, which is correlated to the ON resistances of the two transistors Mfb1, and the set of transistors 201 may further provide an impedance of about −j57880Ω, which is correlated to the OFF capacitive reactances of the two transistors Mfb1. In the embodiment, the set of transistors 202 may be similar to the set of transistors 102 in FIG. 1.

The impedance of the feedback circuit 20 in each gain mode may be shown in Table 2 below:

TABLE 2

| | Vc1 | Vc2 | Impedance of the set of transistors 201 | Impedance of the set of transistors 202 | Impedance of the feedback circuit 20 (Ω) (approx.) |
|---|---|---|---|---|---|
| First gain mode | L | H | −j57880 | 200 | 200 |
| Second gain mode | H | H | 400 | 200 | 133 |
| Third gain mode | L | L | −j57880 | −j28940 | −j19293 |
| Fourth gain mode | H | L | 400 | −j28940 | 400 |

In the first gain mode, the set of transistors 201 is turned off and the set of transistors 202 is turned on, so the set of transistors 201 provides an impedance of −j58770Ω and the set of transistors 202 provides an impedance of mon. Therefore, the impedance of the feedback circuit 10 is calculated as the parallel impedance of the above −j58770Ω and 200Ω, that is, 199.998-j0.69. In such a case, since the real part (199.998) is much larger than the imaginary part (0.69) of the parallel impedance, the impedance of the feedback circuit 10 is about 199.998, i.e., about 200Ω.

Similar to the calculation for Table 1, the feedback circuit 20 may provide an impedance of about 133Ω in the second gain mode, an impedance of about −j19293Ω in the third gain mode, and an impedance of about 400Ω in the fourth gain mode.

It can be seen from Table 2 that among the four gain modes, the minimum impedance of the feedback circuit 20 is 133Ω, and the maximum impedance is −j19293. Therefore, the feedback circuit 20 may provide a wider range of impedances.

Figure 3:
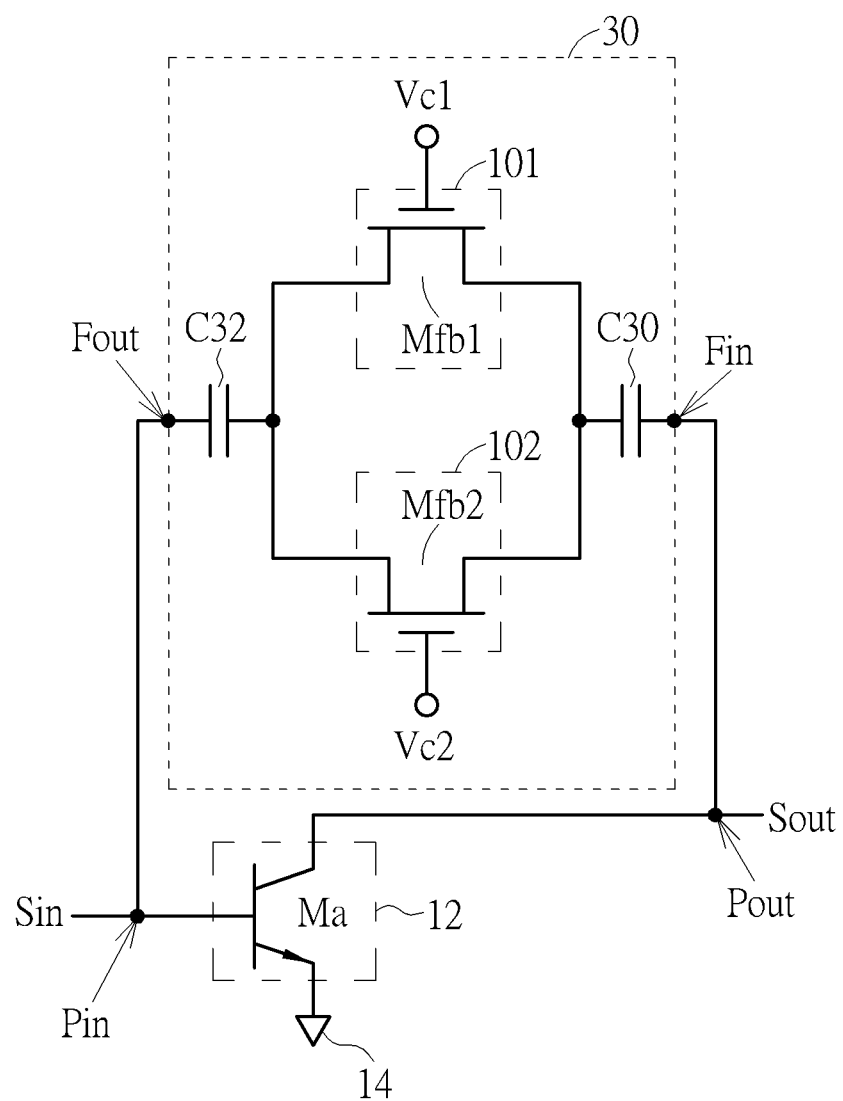
FIG. 3 is a schematic diagram of an RF circuit according to another embodiment of the invention.

FIG. 3 is a schematic diagram of an RF circuit 3 according to another embodiment of the invention. The main difference between the RF circuit 3 and the RF circuit 1 lies in that the feedback circuit 30 of the RF circuit 3 further includes capacitors C30 and C32. The main differences between the RF circuit 3 and the RF circuit 1 are explained as follows, and the explanations for other components may be found in the preceding paragraphs, and will not be repeated here.

The capacitor C30 includes a first terminal coupled to the input terminal Fin of the feedback circuit 30, and a second terminal coupled to the first terminal of the set of transistors 101 and to the first terminal of the set of transistors 102. The capacitor C32 includes a first terminal coupled to the second terminal of the set of transistors 101 and to the second terminal of the set of transistors 102, and a second terminal coupled to the output terminal Fout of the feedback circuit 30.

In the embodiment in FIG. 3, the capacitors C30 and/or C32 may be used to block the DC component. In some embodiments, the feedback circuit 30 may omit the capacitor C30 or C32.

Figure 4:
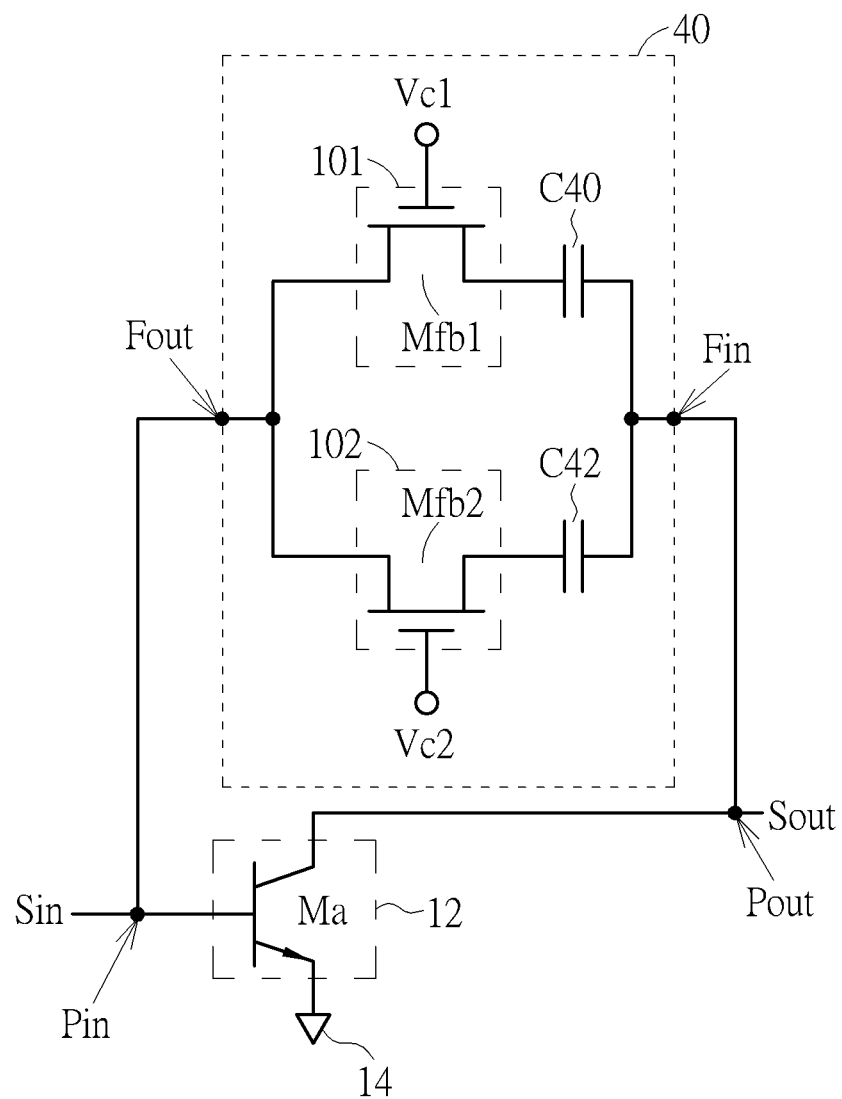
FIG. 4 is a schematic diagram of an RF circuit according to another embodiment of the invention.

FIG. 4 is a schematic diagram of an RF circuit 4 according to another embodiment of the invention. The main difference between the RF circuit 4 and the RF circuit 1 is that the feedback circuit 40 of the RF circuit 4 further includes branch capacitors C40 and C42. The main differences between the RF circuit 4 and the RF circuit 1 are explained as follows, and the explanations for other components may be found in the preceding paragraphs, and will not be repeated here.

The branch capacitor C40 may be coupled between the input terminal Fin of the feedback circuit 40 and the set of transistors 101. For example, the branch capacitor C40 may include a first terminal coupled to the input terminal Fin of the feedback circuit 40, and a second terminal coupled to the first terminal of the set of transistors 101. The branch capacitor C42 may be coupled between the input terminal Fin of the feedback circuit 40 and the set of transistors 102. For example, the branch capacitor C42 may include a first terminal coupled to the input terminal Fin of the feedback circuit 40, and a second terminal coupled to the first terminal of the set of transistors 102. In other embodiments, the branch capacitor C40 may also be coupled between the set of transistors 101 and the output terminal Fout of the feedback circuit 40, and/or the branch capacitor C42 may be coupled between the set of transistors 102 and the output terminal Fout of the feedback circuit 40.

In the embodiment in FIG. 4, the branch capacitors C40 and/or C42 may be used to block DC components. In some embodiments, the feedback circuit 40 may omit the branch capacitor C40 or C42.

Figure 5:
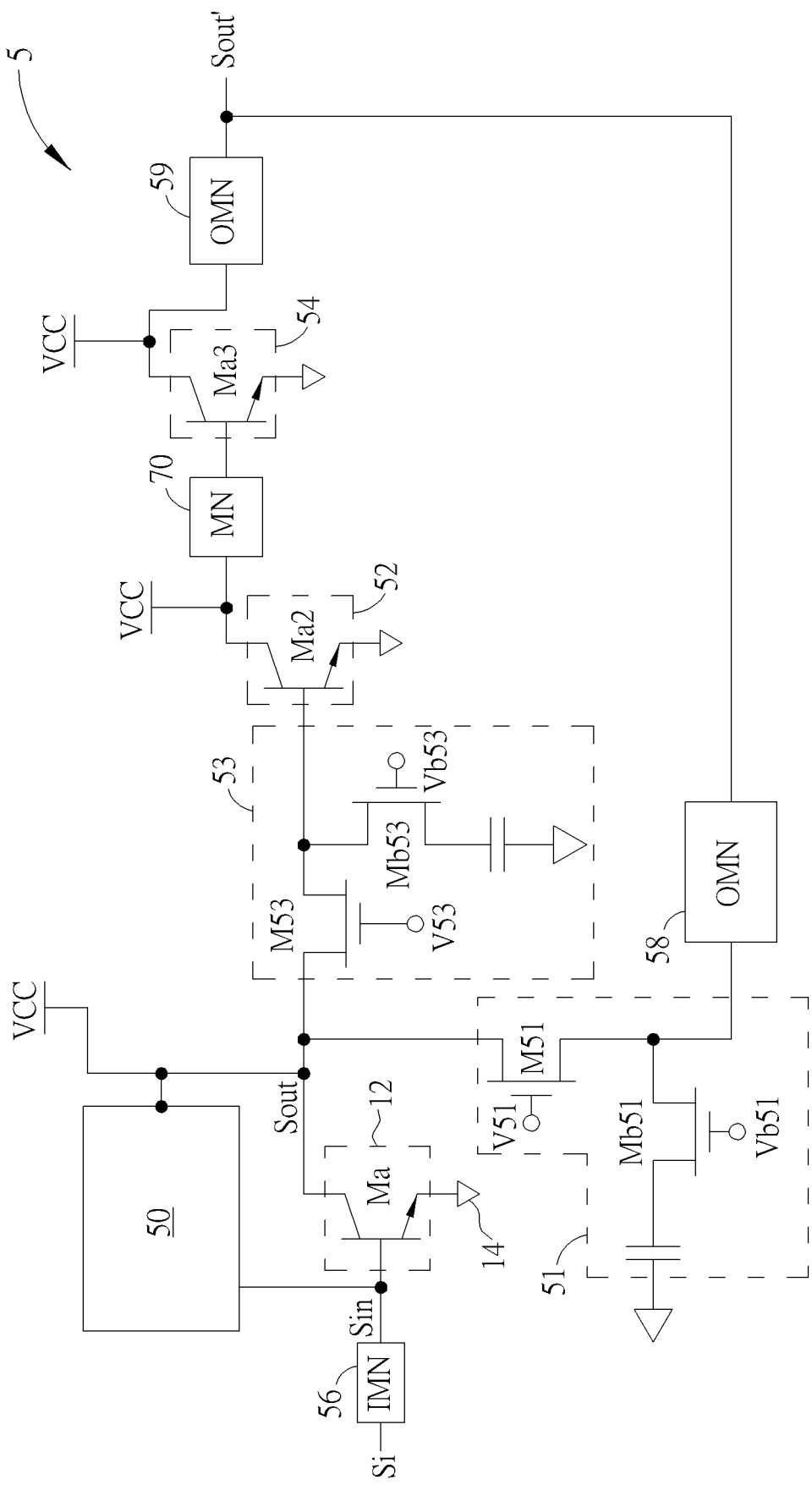
FIG. 5 is a schematic diagram of an RF circuit according to another embodiment of the invention.

FIG. 5 is a schematic diagram of an RF circuit 5 according to another embodiment of the invention. The RF circuit 5 may operate in three or more power modes, including a low power mode, a medium power mode and a high power mode. The RF circuit 5 may include an input matching network (IMN) 56, amplifier circuits 12, 52 and 54, a feedback circuit 50, switches 51 and 53, output matching circuits (OMN) 58 and 59, and a matching circuit (MN) 70. The amplifier circuit 12 may amplify the input signal Sin to generate the output signal Sout, and the amplifier circuits 52 and 54 may further amplify the signal Sout to generate an output signal Sout'. In other words, the RF circuit 5 may amplify the input signal Sin to generate the output signal Sout', and the power of the output signal Sout' may be higher than that of the output signal Sout. The gain of the RF circuit 5 may be adjusted by adjusting the feedback amount of the feedback circuit 50.

The input matching circuit 56 includes a first terminal configured to receive the front-end signal Si, and a second terminal configured to output the input signal Sin. In some embodiments, the input matching circuit 56 may perform impedance matching for the front-end signal Si to generate the input signal Sin.

The amplifier circuit 12 includes an input terminal coupled to the second terminal of the input matching circuit 56, and an output terminal configured to receive the power supply voltage VCC via a connection circuit. The connection circuit may include any combination of resistive, capacitive, and inductive components, and may further include a filter.

The feedback circuit 50 includes an input terminal coupled to the output terminal of the amplifier circuit 12, and an output terminal coupled to the input terminal of the amplifier circuit 12. The amplifier circuit 12 and the feedback circuit 50 may receive the supply voltage VCC. The circuit configuration and operation of the feedback circuit 50 may be similar to one of the feedback circuits 10 to 40, and the explanation therefor will not be repeated here.

The amplifier circuit 52 includes an input terminal coupled to the output terminal of the amplifier circuit 12, and an output terminal configured to receive the power supply voltage VCC via a connection circuit. Furthermore, the input terminal of the amplifier circuit 52 may be coupled to the output terminal of the amplifier circuit 12 via the switch 53.

In FIG. 5, the switch 53 may be coupled between the amplifier circuit 12 and the amplifier circuit 52. Furthermore, the switch 53 includes a first terminal coupled to the output terminal of the amplifier circuit 12, and a second terminal coupled to the input terminal of the amplifier circuit 52. In the embodiment, the switch 53 may control the signal transmission between the amplifier circuit 12 and the amplifier circuit 52.

The amplifier circuit 54 includes an input terminal coupled to the output terminal of the amplifier circuit 52 via the matching circuit 70, and an output terminal configured to receive the power supply voltage VCC via a connection circuit. The matching circuit 70 may be, but is not limited to, coupled between the amplifier circuit 52 and the amplifier circuit 54. In other embodiments, another intermediate matching circuit may also be provided between the amplifier circuit 12 and the amplifier circuit 52.

The output matching circuit 59 may be coupled to the output terminal of the amplifier circuit 54. For example, the output matching circuit 59 may include a first terminal coupled to the output terminal of the amplifier circuit 54, and a second terminal configured to output the output signal Sout'.

The output terminal of the amplification circuit 12 may be further coupled to the output matching circuit 58 via the switch 51. Specifically, the output matching circuit 58 includes a first terminal coupled to the output terminal of the amplifier circuit 12 via the switch 51, and a second terminal configured to output the output signal Sout'. In some embodiments, the output matching circuit 58 may perform impedance matching for the output signal Sout to generate the output signal Sout'. The output matching circuit 59 may perform impedance matching for the amplified signal at the output terminal of the amplifier circuit 54 to generate the output signal Sout'.

In FIG. 5, the switch 51 may be coupled between the amplifier circuit 12 and the output matching circuit 58. Furthermore, the switch 51 includes a first terminal coupled to the output terminal of the amplifier circuit 12, and a second terminal coupled to the input terminal of the output matching circuit 58. In the embodiment, the switch 51 may control the signal transmission between the amplifier circuit 12 and the output matching circuit 58. In other words, the output matching network 58 may be coupled to the output terminal of the amplifier circuit 12 via the switch 51.

In FIG. 5, the switch 51 includes transistors M51 and Mb51. The transistor M51 includes a first terminal coupled to the input terminal of the switch 51, a second terminal coupled to the output terminal of the switch 51, and a control terminal configured to receive a control signal V51. The transistor Mb51 includes a first terminal coupled to the output terminal of the switch 51, a second terminal coupled to the reference voltage terminal, and a control terminal configured to receive a control signal Vb51. In some embodiments, the control signal V51 and the control signal Vb51 may be complementary signals or inverted signals. In FIG. 5, the switch 53 includes transistors M53 and Mb53. The transistor M53 includes a first terminal coupled to the input terminal of the switch 53, a second terminal coupled to the output terminal of the switch 53, and a control terminal configured to receive a control signal V53. The transistor Mb53 includes a first terminal coupled to the output terminal of the switch 53, a second terminal coupled to the reference voltage terminal, and a control terminal configured to receive a control signal Vb53. In some embodiments, the control signal V51 and the control signal Vb51 may be complementary signals or inverted signals. In the embodiments, the transistors M51, Mb51, M53 and Mb53 may be NMOS transistors. In addition, in some embodiments, the control signals V51 and Vb53 may be the same signal, and the control signals V51b and V53 may be the same signal.

In operation, the signal Sout at the output terminal of the amplifier circuit 12 may be transmitted via a first path to generate the signal Sout', or may be transmitted via a second path to generate the signal Sout'. For example, the first path includes the switch 53, the amplifier circuits 52 and 54, and the output matching circuit 59. The second path may include the switch 51 and the output matching circuit 58. The first path may be the medium power path and/or the high power path, and the second path may be the low power path. That is, the switch 53, the amplifier circuit 52, the amplifier circuit 54, and the output matching circuit 58 may form a medium/high power path, and the switch 51 and the output matching circuit 58 may form a low power path.

In the low power mode, the low power path may be turned on and the medium/high power path may be turned off, such that the signal Sout may be transmitted from the output terminal of the amplifier circuit 12 via the switch 51 and the output matching circuit 58 to generate the signal Sout'. In the middle power mode or the high power mode, the middle/high power path may be turned on, and the low power path may be turned off, such that the signal Sout at the output terminal of the amplifier circuit 12 may be transmitted via the switch 53, the amplifier circuit 52, the amplifier circuit 54, and the output matching circuit 58 to generate the signal Sout'. The switches 51 and 53 may be used to switch between the low power path and the medium/high power path. For example, the signal transmission on the low power path may be controlled by the switch 51, and the signal transmission on the medium/high power path may be controlled by the switch 53.

In some embodiments, in the low power mode, the control signals V51 and Vb53 may be set to the logic high level, and the control signals Vb51 and V53 may be set to the logic low level. The transistor M51 may be turned on and the transistor M53 may be turned off. The input signal Sin may be amplified by the amplifier circuit 12 but not by the amplifier circuits 52 and 54. Therefore, the gain of the RF circuit 5 may be dependent on the amplifier circuit 12. In such a case, in order to achieve a desired gain, a less feedback amount of the feedback circuit 50 may be achieved by adjusting the impedance of the feedback circuit 50 to a relatively high level. For example, referring to the embodiment shown in FIG. 1 and Table 1, the feedback circuit 50 may be set to the third gain mode to reduce the feedback amount.

In some embodiments, in the middle power mode or the high power mode, the control signals V51 and Vb53 may be set to the logic low level and the control signals Vb51 and V53 may be set to the logic high level to turn off the transistors M51 and Mb53 and turn on the transistors Mb51 and M53, the input signal Sin may be amplified by the amplifier circuit 12, 52, and 54, The amplifier circuit 12 may be the first-stage amplifier circuit, the amplifier circuit 52 may be the second-stage amplifier circuit, and the amplifier circuit 54 may be the third-stage amplifier circuit. In such a case, the mode switching may be achieved by changing the feedback amount of the feedback circuit 50. In some embodiments in FIG. 1 and Table 1, when a high gain is desired, the feedback circuit 50 may be set to the first gain mode or the fourth gain mode to reduce the feedback amount. When a low gain is desired, the feedback circuit 50 may be set to a second gain mode to increase the feedback amount.

In the embodiment in FIG. 5, the amplifier circuit 52 may include a transistor Ma2, and the amplifier circuit 54 may include a transistor Ma3. The amplifying transistor Ma2 includes a first terminal coupled to the output terminal of the amplifier circuit 52, a second terminal coupled to the reference voltage terminal, and a control terminal coupled to the input terminal of the amplifier circuit 52. The amplifying transistor Ma3 includes a first terminal coupled to the output terminal of the amplifier circuit 54, a second terminal coupled to the reference voltage terminal, and a control terminal coupled to the input terminal of the amplifier circuit 54. In some embodiments, the transistors Ma, Ma2 and Ma3 may be of the same type of transistors. In FIG. 5, the transistors Ma, Ma2 and Ma3 are N-type BJTs. While FIG. 5 shows that the amplifier circuits 12, 52 and 54 each include one transistor, those skilled in the art would recognize that multiple transistors may be configured in the amplifier circuits 12, 52 and/or 54 as desired. In some embodiments, the amplifier circuit 12 may include K transistors coupled in cascode, where K is a positive integer.

Figure 6:
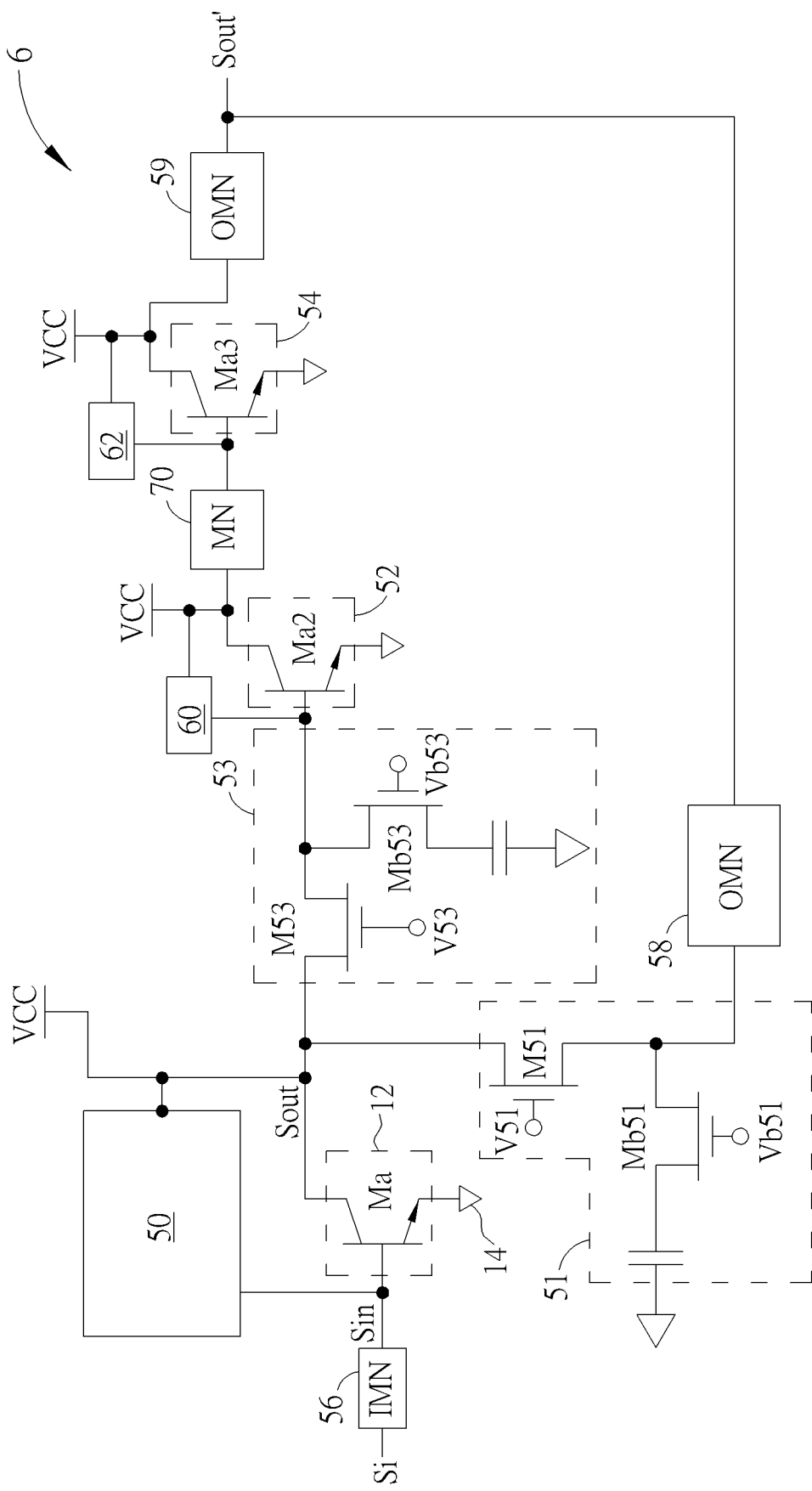
FIG. 6 is a schematic diagram of an RF circuit according to another embodiment of the invention.

FIG. 6 is a schematic diagram of an RF circuit 6 according to another embodiment of the invention. The main difference between the RF circuit 6 and the RF circuit 5 is that the RF circuit 6 further includes feedback circuits 60 and 62. The main differences between the RF circuit 6 and the RF circuit 5 are explained as follows, and the explanations for other components may be found in the preceding paragraphs, and will not be repeated here.

The feedback circuit 60 is coupled between the output terminal and the input terminal of the amplifier circuit 52 to control the feedback amount between the output terminal and the input terminal of the amplifier circuit 52. The feedback circuit 62 is coupled between the output terminal and the input terminal of the amplifier circuit 54 to control the feedback amount between the output terminal and the input terminal of the amplifier circuit 54. The circuit configuration and operation of the feedback circuits 60 and 62 may be similar to one of the feedback circuits 10 to 40, and the explanation thereof will not be repeated here. In another implementation, the RF circuit 6 may include one of the feedback circuits 60 and 62. For example, the RF circuit 6 may include the feedback circuit 60, and the feedback circuit 62 may be omitted from the RF circuit 6. In yet another embodiment, the feedback circuit 60 may be coupled between the output terminal of the amplifier circuit 54 and the input terminal of the amplifier circuit 52 (not shown in figures).

In the RF circuits 1 to 6, the feedback circuits may not include a resistor. The feedback circuit may use the ON resistance and OFF capacitive reactance of the transistor to control the feedback amount, so as to flexibly adjust the gain of the RF circuit, thereby significantly increasing the gain and reducing the circuit area.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A feedback circuit coupled between an output terminal and an input terminal of an amplifier circuit, the feedback circuit comprising:
an input terminal;
an output terminal;
a first set of transistors coupled between the input terminal and the output terminal of the feedback circuit, comprising a first terminal, a second terminal, and a control terminal configured to receive a first control signal, the first set of transistors being configured to provide two or more impedances according to the first control signal, the two or more impedances of the first set of transistors being no lower than a first predetermined impedance; and
a second set of transistors coupled between the input terminal and the output terminal of the feedback circuit, comprising a first terminal coupled to the first terminal of the first set of transistors, a second terminal coupled to the second terminal of the first set of transistors, and a control terminal configured to receive a second control signal, the second set of transistors being configured to provide two or more impedances according to the second control signal, the two or more impedances of the second set of transistors being no lower than a second predetermined impedance.

2. The feedback circuit of claim 1, wherein:
the first predetermined impedance is between 100 ohms (Ω) and 500Ω; or
the second predetermined impedance is between 100Ω and 500Ω.

3. The feedback circuit of claim 1, wherein:
the first set of transistors is turned on or off according to the first control signal;
the first set of transistors provides a first ON resistance when turned on;
the first set of transistors provides a first OFF capacitive reactance when turned off;
the second set of transistors is turned on or off according to the second control signal;
the second set of transistors provides a second ON resistance when turned on; and
the second set of transistors provides a second OFF capacitive reactance when turned off.

4. The feedback circuit of claim 3, wherein:
when the first set of transistors is turned on and the second set of transistors is turned off, the feedback circuit has an impedance correlated to the first ON resistance and the second OFF capacitive reactance.

5. The feedback circuit of claim 3, wherein:
when the first set of transistors is turned on and the second set of transistors is turned on, the feedback circuit has an impedance correlated to the first ON resistance and the second ON resistance.

6. The feedback circuit of claim 3, wherein:
when the first set of transistors is turned off and the second set of transistors is turned off, the feedback circuit has an impedance correlated to the first OFF capacitive reactance and the second OFF capacitive reactance.

7. The feedback circuit of claim 6, wherein:
the impedance of the feedback circuit is equal to a parallel impedance of the first OFF capacitive reactance and the second OFF capacitive reactance.

8. The feedback circuit of claim 3, wherein:
when the first set of transistors is turned off and the second set of transistors is turned on, the feedback circuit has an impedance correlated to the first OFF capacitive reactance and the second ON resistance.

9. The feedback circuit of claim 1, wherein:
the first set of transistors includes M first transistors coupled in cascode, M being a positive integer; and
the second set of transistors includes N second transistors coupled in cascode, N being a positive integer.

10. The feedback circuit of claim 9, wherein M is equal to 1, and N is equal to 1.

11. The feedback circuit of claim 9, wherein the M first transistors and the N second transistors comprise bipolar junction transistors or metal oxide semiconductor field effect transistors.

12. The feedback circuit of claim 1, further comprising:
a first capacitor coupled to the input terminal of the feedback circuit; and/or
a second capacitor coupled to the output terminal of the feedback circuit.

13. The feedback circuit of claim 1, further comprising:
a first branch capacitor coupled between the first set of transistors and the input terminal of the feedback circuit; and
a second branch capacitor coupled between the second set of transistors and the input terminal of the feedback circuit.

14. A radio frequency (RF) circuit comprising:
a first amplifier circuit comprising an input terminal and an output terminal, and configured to amplify an RF signal; and
a first feedback circuit coupled between the output terminal and the input terminal of the first amplifier circuit, the first feedback circuit comprising:
an input terminal;
an output terminal;
a first set of transistors coupled between the input terminal and the output terminal of the first feedback circuit, comprising a first terminal, a second terminal, and a control terminal configured to receive a first control signal, the first set of transistors being configured to provide two or more impedances according to the first control signal, the two or more impedances of the first set of transistors being no lower than a first predetermined impedance; and
a second set of transistors coupled between the input terminal and the output terminal of the first feedback circuit, comprising a first terminal coupled to the first terminal of the first set of transistors, a second terminal coupled to the second terminal of the first set of transistors, and a control terminal configured to receive a second control signal, the second set of transistors being configured to provide two or more impedances according to the second control signal, the two or more impedances of the second set of transistors being no lower than a second predetermined impedance.

15. The RF circuit of claim 14, further comprising:
a second amplifier circuit comprising:
an input terminal coupled to the output terminal of the first amplifier circuit; and
an output terminal.

16. The RF circuit of claim 15, wherein:
the input terminal of the second amplifier circuit is coupled to the output terminal of the first amplifier circuit via a first switch; and
the RF circuit further comprises an output matching network coupled to the output terminal of the first amplifier circuit via a second switch.

17. The RF circuit of claim 15, further comprising:
a second feedback circuit coupled between the output terminal and the input terminal of the second amplifier circuit.

18. The RF circuit of claim 15, further comprising:
a third amplifier circuit comprising:
- an input terminal coupled to the output terminal of the second amplifier circuit; and
- an output terminal; and a third feedback circuit coupled between the input terminal and the output terminal of the third amplifier circuit.

19. The RF circuit of claim 14, wherein the first amplifier circuit comprises K transistors coupled in cascode, and K is a positive integer.

\* \* \* \* \*